(12) United States Patent
Ahn et al.

(10) Patent No.: US 8,675,180 B2
(45) Date of Patent: Mar. 18, 2014

(54) MASKLESS EXPOSURE APPARATUS AND METHOD OF ALIGNMENT FOR OVERLAY IN MASKLESS EXPOSURE

(75) Inventors: Sung Min Ahn, Seoul (KR); Ho Seok Choi, Suwon-si (KR); Sang Don Jang, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 333 days.

(21) Appl. No.: 13/064,558

(22) Filed: Mar. 31, 2011

(65) Prior Publication Data

US 2011/0273690 A1 Nov. 10, 2011

(30) Foreign Application Priority Data

May 6, 2010 (KR) .................. 10-2010-0042384

(51) Int. Cl.
*G01B 11/00* (2006.01)
*G03B 27/32* (2006.01)
*G03B 27/42* (2006.01)
*G03B 27/54* (2006.01)

(52) U.S. Cl.
USPC ................. 355/77; 355/53; 355/67; 356/399; 356/400

(58) Field of Classification Search
CPC ............ G03F 7/70291; G03F 7/70633; G03F 7/70775; G03F 9/70; G03F 9/7003
USPC ........ 355/53, 67, 77; 356/399–401, 614–616, 356/620
See application file for complete search history.

(56) References Cited

U.S. PATENT DOCUMENTS

| | | |
|---|---|---|
| 2007/0231717 A1* | 10/2007 | Rivers et al. ..................... 430/22 |
| 2009/0280441 A1* | 11/2009 | Nara .............................. 430/326 |
| 2011/0116064 A1* | 5/2011 | Ahn et al. ......................... 355/53 |
| 2012/0081682 A1* | 4/2012 | Ahn et al. ......................... 355/67 |
| 2012/0264066 A1* | 10/2012 | Chen et al. ..................... 430/322 |
| 2013/0044315 A1* | 2/2013 | Ahn et al. ..................... 356/138 |

* cited by examiner

*Primary Examiner* — Toan Ton
*Assistant Examiner* — Colin Kreutzer
(74) *Attorney, Agent, or Firm* — Harness, Dickey & Pierce, P.L.C.

(57) ABSTRACT

Example embodiments are directed to a maskless exposure device and an alignment method. The alignment method performs an overlay of each layer of a plurality of layers on a substrate using a virtual mask in a maskless exposure technique. The maskless exposure device and the alignment method use a virtual mask instead of a physical mask used in a conventional mask exposure, a virtual target mark instead of an alignment mark used in the conventional mask exposure, and perform an overlay per layer, such that the deposition exposure can be achieved in the maskless exposure.

15 Claims, 7 Drawing Sheets

MASKLESS EXPOSURE APPARATUS AND METHOD OF ALIGNMENT FOR OVERLAY IN MASKLESS EXPOSURE

CROSS-REFERENCE TO RELATED APPLICATION(S)

This application claims priority under 35 U.S.C. §119 to Korean Patent Application No. 2010-0042384, filed on May 6, 2010 in the Korean Intellectual Property Office, the entire disclosure of which is incorporated herein by reference.

BACKGROUND

1. Field

Example embodiments relate to an alignment method for performing an overlay using a virtual mask in a maskless exposure process.

2. Description of the Related Art

Generally, a method of forming a pattern on a substrate (or a semiconductor wafer) contained in a Liquid Crystal Display (LCD), a Plasma Display Panel (PDP), a Flat Panel Display (FPD) may include the following. First, a pattern material is deposited over a substrate, and is selectively exposed using a photomask, such that a specific pattern material part having a changed chemical property or the remaining parts other than the specific pattern material part is selectively removed, thereby forming a pattern.

However, as the size of substrate is gradually increased and the precision of pattern is also gradually increased, a maskless exposure process of forming a desired pattern on the substrate (or semiconductor wafer) without using a photomask has been recently developed. The maskless exposure technique may not include costs associated with manufacturing/cleaning/keeping a mask, may freely design a panel, and does not require a mask manufacturing time, resulting in a reduction in lead time. Since there is no mask defect, there is no damage in a fabrication process. Because a hybrid layout is used, the production flexibility is increased.

A plurality of layers is deposited over a substrate, such that they form a pattern over the substrate through an exposure process. The higher the precision of pattern, the higher the number of layers each having the pattern. When a plurality of layers is deposited over one substrate, a conventional mask exposure method is designed to arrange the layers using alignment marks of a mask and a substrate (or wafer).

However, since a mask is not present in the maskless exposure, it may not be possible to recognize a relative position between alignment marks of a mask and a substrate.

SUMMARY

According to example embodiments, a maskless exposure device includes a stage configured to move a substrate; a light modulation element configured to illuminate an exposure beam of a beam spot array form to expose a pattern on the substrate, and generate a virtual mask; an alignment unit configured to measure a position of an alignment mark in the layer; and a controller configured to calculate a position of a target mark present on the virtual mask using the measured alignment mark position, and perform alignment between the virtual mask and the substrate using the calculated target mark position.

According to example embodiments, the light modulation element is further configured to expose the pattern on at least one layer of a plurality of layers on the substrate.

According to example embodiments, each layer includes at least two alignment marks.

According to example embodiments, the alignment unit is configured to measure the position of the alignment mark for each layer.

According to example embodiments, the alignment unit is further configured to measure the position of the alignment mark present on an i-th layer on the substrate after a fabrication process is performed on the i-th layer of the plurality of layers and prior to exposing the (i+1)-th layer.

According to example embodiments, the fabrication process includes at least one of exposing, developing, etching, depositing and depositing a photoresist on the substrate.

According to example embodiments, the controller is configured to calculate a position between the calculated target mark position and the measured alignment mark position relative to each other, and to determine an amount by which the stage is moved such that an overlay of the calculated target mark and the measured alignment mark is achieved for each layer in response to the calculated relative position.

According to example embodiments, the controller is further configured to compensate the amount by which the stage moves to be equal to the calculated relative position before the (i+1)-th layer is exposed, and to perform alignment between the virtual mask and the substrate.

According to example embodiments, the target mark is a virtual alignment mark that is used as a reference during alignment of the overlay.

According to example embodiments, an alignment method for overlay in a maskless exposure includes placing a substrate on a stage; generating a virtual mask using a light modulation element so as to expose a pattern on the substrate; measuring a position of an alignment mark in the layer; calculating a position of a target mark on the virtual mark using the measured alignment mark position; and performing alignment between the virtual mask and the substrate using the calculated target mark position.

According to example embodiments, the alignment method further includes exposing the pattern on at least one layer of a plurality of layers on the substrate.

According to example embodiments, the alignment method further includes measuring the position of the alignment mark present on an i-th layer on the substrate after a fabrication process is performed on the i-th layer of the plurality of layers and prior to exposing the (i+1)-th layer.

According to example embodiments, the fabrication process includes at least one of exposing, developing, etching, depositing and depositing a photoresist on the substrate.

According to example embodiments, the alignment method further includes calculating a position between the calculated target mark position and the measured alignment mark position relative to each other; determining an amount by which the stage is moved according to the calculated relative position; and compensating for the determined moving amount of the stage, and performing overlay of the plurality of layers.

According to example embodiments, the alignment method further includes using the target mark as a reference during aligning of the overlay of the plurality of layers, the target mark being a virtual alignment mark.

BRIEF DESCRIPTION OF THE DRAWINGS

The above and other features and advantages will become more apparent by describing in detail example embodiments with reference to the attached drawings. The accompanying drawings are intended to depict example embodiments

DETAILED DESCRIPTION

Figure 1:
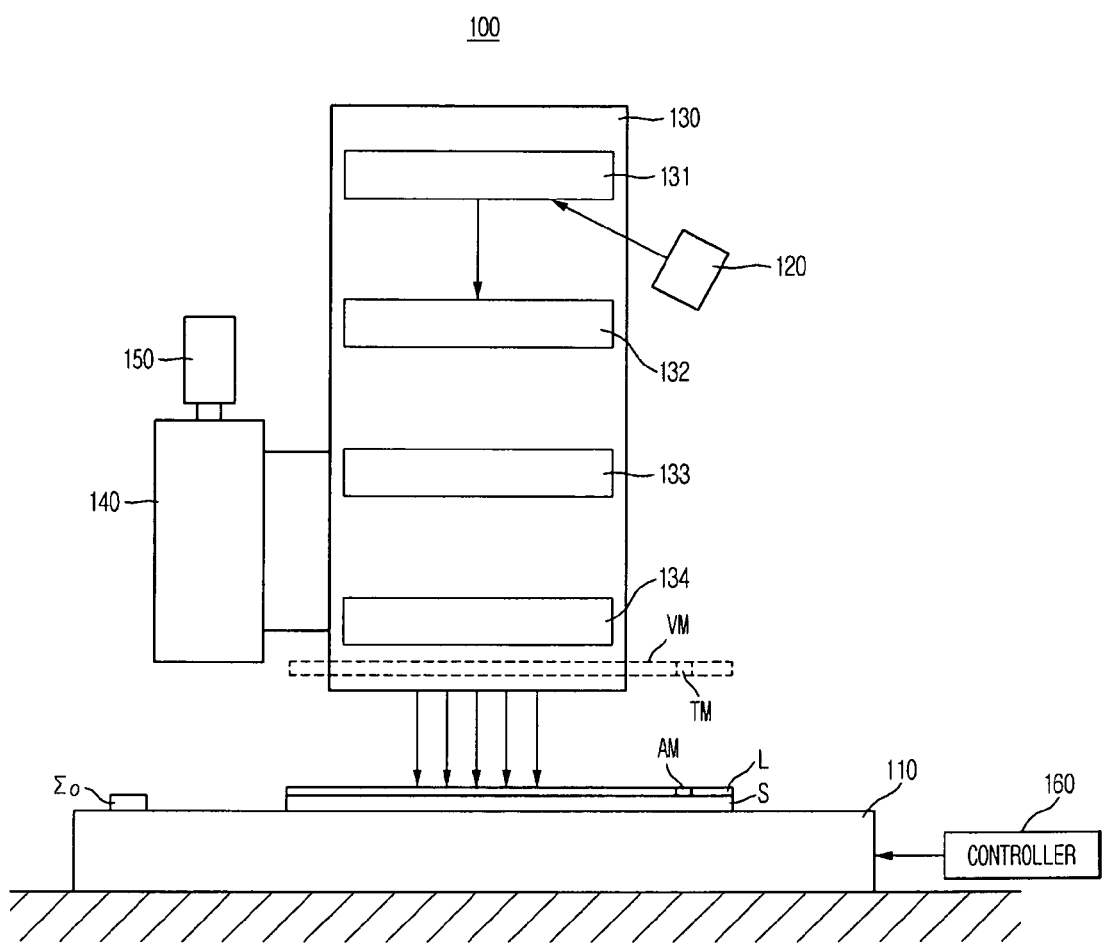
FIG. 1 illustrates a maskless exposure device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates a maskless exposure device according to example embodiments.

Referring to FIG. 1, the maskless exposure device 100 according to example embodiments includes a moving part 110, a light source unit 120, a projection unit 130, an alignment unit 140, a mark capturing unit 150, and a controller 160.

The moving part 110 is a stage for supporting a substrate (S: all samples (for example, wafer, glass) on which a desired pattern is to be formed) to be exposed. When aligning the virtual mask (VM) and the substrate (S) prior to the execution of the exposure, the moving part 110 moves in response to an indication signal from the controller 160, such that the virtual mask (VM) and the substrate (S) are correctly aligned. In this case, a layer (L) acting as an exposure layer is deposited over the substrate (S), and the layer (L) forms a pattern over the substrate (S) through an exposure process.

The light source unit 120 outputs a laser beam for light exposure, and includes a semiconductor laser or an ultraviolet lamp or the like. The laser beam is output to the substrate (S) placed on the moving part 110 through the projection unit 130.

The projection unit 130 is fixed at one side of the moving part 110, divides a pattern forming light for forming the VM pattern into a plurality of spot beams, and projects the plurality of spot beams on the substrate (S).

The projection unit 130 includes a light modulation element 131 for modulating a light output from the light source unit 120 into a light having a virtual mask (VM) pattern, a first projection lens 132 for enlarging the modulated light output from the light modulation element 131, a Multi Lens Array (MLA) 133, and a second projection lens 134. The MLA 133 includes a plurality of lenses configured in the form of an array, splits the enlarged light having the VM pattern into a plurality of lights, and condenses the plurality of lights. The second projection lens 134 adjusts a resolution of the condensed light, and allows the condensed light to penetrate therethrough.

The light modulation element 131 includes a Spatial Light Modulator (SLM). For example, the light modulation element 131 may be any of a Micro Electro Mechanical Systems (MEMS)—type Digital Micro-mirror Device (DMD), a two-dimensional Grating Light Valve (GLV), an electro-optical element formed of translucent ceramic PLZT (lead zirconate titanate), a Ferroelectric Liquid Crystal (FLC), etc. For the sake of explanation, example embodiments assume that the optical modulation element 131 is formed of the DMD.

The DMD is a mirror device, which includes a memory cell and a plurality of micromirrors arranged on the memory cell in the form of an (L×M) matrix. Based on a control signal generated in response to image data, the DMD changes angles of individual micromirrors, reflects a desired light, transmits the reflected light to the first projection lens 132, and transmits the remaining light other than the desired light at a different angle such that the remaining light is blocked.

If a digital signal is recorded in a memory cell of the light modulation element 131 formed of a DMD, the micromirror is inclined in the range of a predetermined/desired angle (e.g., ±12°) on the basis of a diagonal line. On/off control operations of individual micromirrors are controlled by a controller 170 to be described later. The light reflected from the ON-status micromirror exposes an exposure target (generally, PR:photoresist) placed on the substrate (S), and the light reflected from the OFF-status micromirror does not expose the exposure target placed on the substrate (S).

The first projection lens 132 may be comprised of, for example, a double telecentric optical system. An image output from the light modulation element 131 is magnified a predetermined number of times (for example, about four times), such that the magnified image is formed on an aperture plane of the MLA 133.

The second projection lens 134 is also comprised of, for example, a double telecentric optical system, and allows the plurality of spot beams formed on the focal plane of the MLA 133 to be imaged on the substrate (S) after magnifying the plurality of spot beams a predetermined/desired number of times (for example, about once). Although example embodiments disclose that the first projection lens 132 has a magnifying power of 4 and the second projection lens 134 has a magnifying power of 1, example embodiments are not limited only thereto, the magnifying powers of the first and second projection lenses 132 and 134 may be optimally combined with each other according to the size of a desired spot beam and/or a minimum feature size of a pattern to be exposed.

In the MLA 133, a plurality of micro-lenses corresponding to micromirrors of the light modulation element 131 are two-dimensionally arranged.

For example, assuming that the light modulation element 131 is comprised of (1920×400) micromirrors, (1920×400) microlenses are needed for (1920×400) micromirrors. A pitch of the microlens arrangement may be substantially identical to a value obtained when the magnifying power of the first projection lens 132 is multiplied by the micromirror arrangement pitch of the light modulation element 131.

Figure 2:
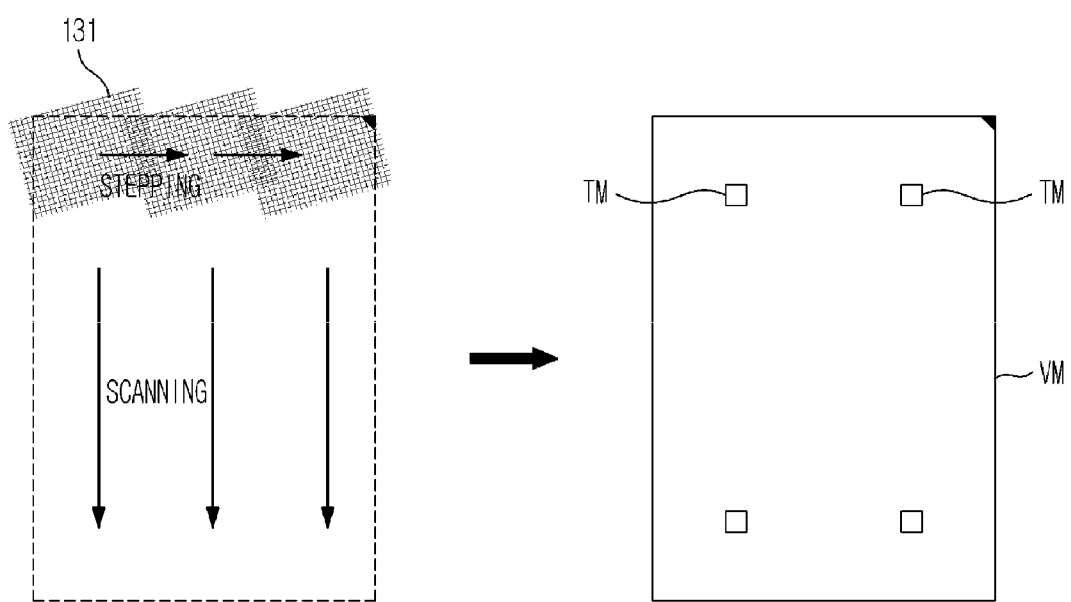
FIG. 2 illustrates a method of generating a virtual mask in a maskless exposure according to example embodiments.

The projection unit 130 generates a virtual mask (VM) having the pattern formed by the plurality of spot beams penetrated through the second projection lens 134, as shown in FIG. 2.

FIG. 2 illustrates a method of generating a virtual mask in a maskless exposure according to example embodiments.

Referring to FIG. 2, the VM is not physically present, and is formed by a pattern caused by on/off operations of several spot beams that are turned on or off in response to a pre-stored/desired pattern. The VM performs scanning of the moving part 110 in the scanning direction (Y-axis direction), and performs stepping the moving part 110 in the sub-scanning direction (X-axis direction), such that it has a patterning size to be formed on the substrate (S). A virtual target mask (VTM) is present on the VM. The VTM is a virtual reference alignment mark that has the same role as the conventional mask exposure's alignment mark.

The above-mentioned maskless exposure device 100 outputs a light beam through the light source unit 120, and allows the light modulation element 131 to modulate the output light beam of the light source unit 120 into a specific light beam having a VM pattern. The first projection lens 132 magnifies the VM-patterned light beam modulated by the light modulation unit 131. The MLA 133 splits the magnified VM-patterned light beam into a plurality of spot beams, and, allows the plurality of spot beams to be condensed. The second projection lens 134 adjusts a resolution of the condensed light, and allows the condensed light to penetrate therethrough in such a manner that the light exposure can be achieved.

In FIG. 1, the alignment unit 140 is arranged at one side of the projection unit 130, and is used to measure the position of a current Alignment Mark (AM) for each layer so as to perform overlay alignment. Each layer includes at least two AMs.

The mark capturing unit 150 located over the alignment unit 140 captures a current AM carved into the substrate (S) for correct alignment of the VM and the substrate (S) (i.e., a current AM carved into a layer (i-th layer) located just before a corresponding layer (e.g., (i+1)-th layer) to be exposed), and transmits the captured image to the controller 160. At this time, in response to an indication command from the controller 160, the movement of the moving part 110 is controlled until the mark capturing unit 150 captures a current AM carved into the layer (i-th layer) located just before the corresponding layer ((i+1)-th layer) to be exposed.

The controller 160 recognizes the kinematic relation on the basis of the AM position measured by the alignment unit 140, calculates the relative position and/or attitude associated with the TM position (where TM is a virtual TM used as a reference point for overlay alignment), compensates for the relative position amount before the corresponding layer ((i+1)-th TM) is exposed, and performs alignment between the VM and the substrate (S).

That is, the controller 160 compares the position of a current AM, that is carved into the i-th layer located just before the corresponding layer [i.e., (i+1)-th layer] to be exposed, with the position of a virtual TM used as a reference for the overlay alignment (where TM is an alignment mark acquired by the method described in example embodiments), such that it performs the overlay alignment before the corresponding layer [(i+1)-th layer] is exposed.

As described above, the controller 160 calculates the relative distance between the calculated virtual TM and the AM of the layer (i-th layer) located just before the corresponding layer [(i+1)-th layer)] to be exposed, and controls the movement of the moving part 110, such that the VM and the substrate (S) can be correctly aligned.

Hereinafter, a method for searching for and defining a virtual TM located over the virtual mask (VM) so as to perform the overlay in the maskless exposure will hereinafter be descried with reference to the drawings.

Figure 3:
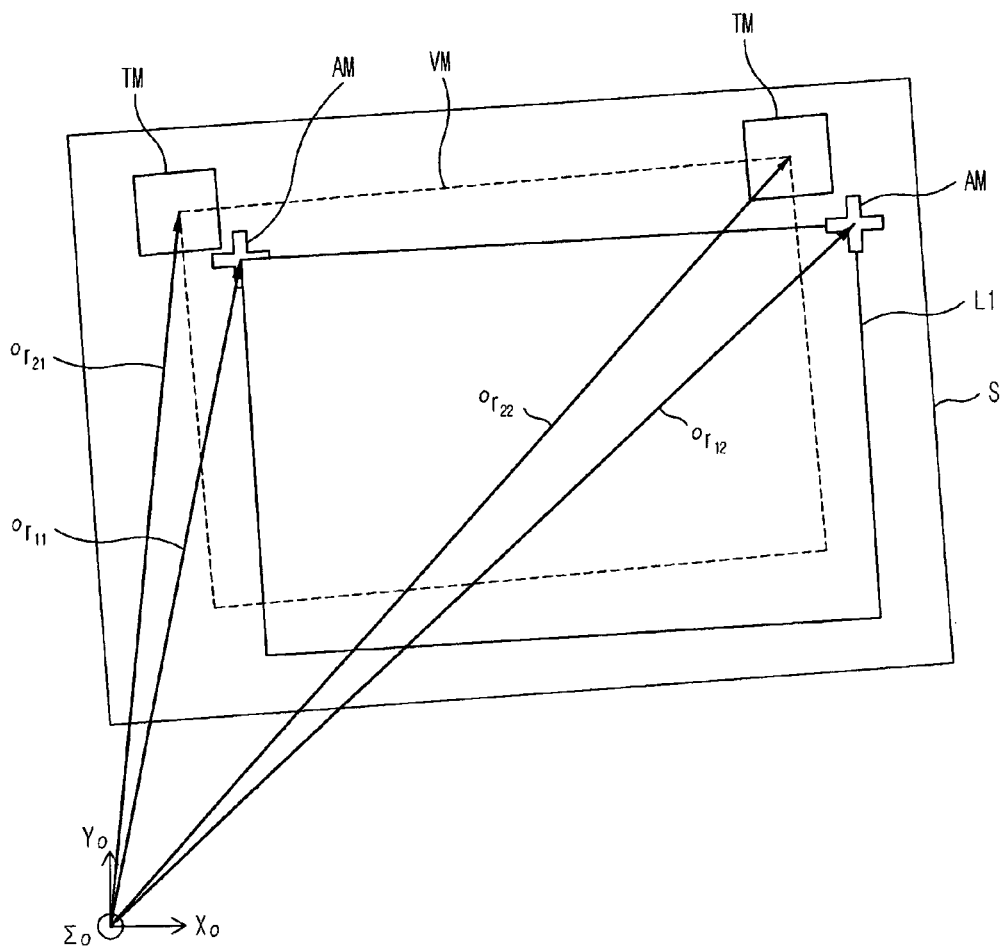
FIG. 3 illustrates a definition of a mark position for use in a maskless exposure according to example embodiments.

FIG. 3 illustrates a definition of a mark position for use in a maskless exposure according to example embodiments.

Figure 4:
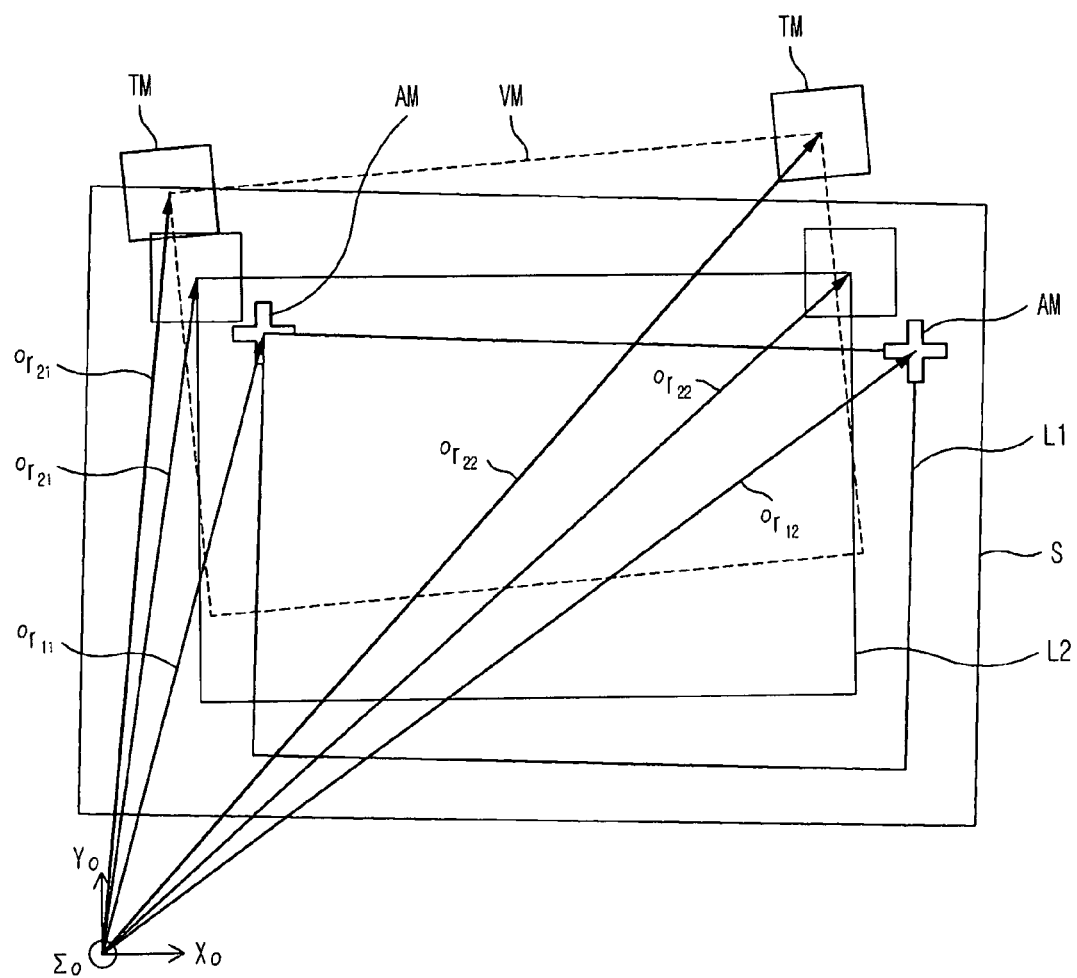
FIG. 4 illustrates a definition of a mark position for use in a maskless exposure according to example embodiments.

FIG. 4 illustrates a definition of a mark position for use in a maskless exposure according to example embodiments.

Referring to FIGS. 3 and 4, the AM is a mark carved into the i-th layer [e.g., the i-th layer (L1)] located over the substrate (S), and is physically present.

The TM is a virtual reference AM located on the VM, and is not physically present.

In FIGS. 3 and 4, physical amounts defined for searching for the TM are as follows.

The following physical amounts may be regarded as a two-dimensional vector amount (position vector).

Although the physical amount is denoted by a three-dimensional vector (X, Y, Z), XY-plane leveling is performed in such a manner that all Z-axis coordinates are identical to one another. Thus, Z is a constant, and thus Z is denoted by '0' (Z=0) for convenience of description.

$\Sigma_o$ is an overlay-associated system coordinate (hereinafter referred to as an overlay coordinate system) related to an overlay to achieve the alignment between the VM and the substrate (S), and is provided on the moving part 110.

$^o r_{ij}$ is the position of a j-th alignment mark (AM) of the i-th layer measured with respect to the overlay coordinate system ($\Sigma_o$).

$^o r'_{ij}$ is the position of a j-th AM of the i-th layer measured with respect to the overlay coordinate system ($\Sigma_o$) that is loaded after the developing of the substrate (S).

$^o t_j$ is the position of a j-th TM of the VM calculated with respect to the overlay coordinate system ($\Sigma_o$).

In the case where the substrate (S: wafer or glass) is located over the moving part 110 and several layers (L; L1, L2 . . . . ) are deposited over the substrate (S), it is necessary to search for the virtual TM present on the VM so as to achieve the alignment between the substrate S and the VM, In order to search for the virtual TM, the position of AM for each layer is measured by the alignment unit 140.

When the alignment unit 140 measures the AM position for each layer, the virtual TM position can be calculated using the following method.

For convenience of description and better understanding of example embodiments, it is assumed that "i" is set to a value of 1 (i=1), "i-th" means a first order and "(i+1)-th" means a second order.

First, after the first layer (L1) is exposed, developed, etched, and deposited, at any time just before the second layer (L2) is exposed by deposition of a photoresist (PR) material, coordinate values $^o r_{11}$ and $^o r_{12}$ present in the first layer L1 in the substrate (S) are measured using the alignment unit 140 as represented by the following equation 1 (See FIG. 3).

$$o_{r_{11}} = \begin{bmatrix} X_{11} \\ Y_{11} \\ 0 \end{bmatrix} = O\_r11 = X11, Y11, 0 \qquad \text{[Equation 1]}$$

$$o_{r_{12}} = \begin{bmatrix} X_{12} \\ Y_{12} \\ 0 \end{bmatrix} = O\_r12 = X12, Y12, 0$$

Referring to Equation 1, by means of $^o r_{11}$ and $^o r_{12}$ coordinate values measured in the first layer (L1), an X-axis ($X_o$) angle ($\alpha$) between AMs can be represented by the following equation 2.

$$\alpha = \arg(^o r_{12} - ^o r_{11}) \qquad \text{[Equation 2]}$$

As described above, after the exposing, developing, etching, depositing, and PR-depositing processes of the first layer L1 are completed, the second layer L2 is exposed.

After the second layer L2 has been exposed, PR developing is performed, and the substrate (S) is re-located (re-loaded) on the moving part 110. After the substrate (S) has been re-loaded, coordinate values ($^o r'_{11}$, $^o r'_{12}$, $^o r'_{21}$, $^o r'_{22}$) are measured using the alignment unit 140 as represented by the following equation 3 (See FIG. 4).

$$o_{r'_{11}} = \begin{bmatrix} X'_{11} \\ Y'_{11} \\ 0 \end{bmatrix} = O\_r11\_p = X11\_p, Y11\_p, 0 \qquad \text{[Equation 3]}$$

$$o_{r'_{12}} = \begin{bmatrix} X'_{12} \\ Y'_{12} \\ 0 \end{bmatrix} = O\_r12\_p = X12\_p, Y12\_p, 0$$

$$o_{r'_{21}} = \begin{bmatrix} X'_{21} \\ Y'_{21} \\ 0 \end{bmatrix} = O\_r21\_p = X21\_p, Y21\_p, 0$$

$$o_{r'_{22}} = \begin{bmatrix} X'_{12} \\ Y'_{22} \\ 0 \end{bmatrix} = O\_r22\_p = X22\_p, Y22\_p, 0$$

Referring to Equation 3, by means of $^o r'_{11}$ and $^o r'_{12}$ coordinate values measured in the first layer (L1), an X-axis ($X_o$) angle ($\beta$) between AMs can be represented by the following equation 4.

$$\beta = \arg(^o r'_{12} - ^o r'_{11}) \qquad \text{[Equation 4]}$$

By means of not only the coordinate values of position vectors ($^o r_{11}$, $^o r_{12}$, $^o r'_{11}$, $^o r'_{12}$, $^o r'_{21}$, and $^o r'_{22}$) measured by Equations 1 and 3, but also angle values ($\alpha$ and $\beta$) calculated by Equations 2 and 4, coordinate values of the positions ($^o r_{21}$ and $^o r_{22}$) of a TM contained in the VM can be calculated by the following equation 5.

$$o_{r_{21}} = \qquad \text{[Equation 5]}$$

$$\begin{bmatrix} X_{11} + (X'_{21} - X'_{11})\cos(\alpha - \beta) - (Y'_{21} - Y'_{11})\sin(\alpha - \beta) \\ Y'_{11} + (X'_{21} - X'_{11})\sin(\alpha - \beta) - (Y'_{21} - Y'_{11})\cos(\alpha - \beta) \\ 0 \end{bmatrix}$$

$$o_{r_{22}} =$$

$$\begin{bmatrix} X'_{12} + (X'_{21} - X'_{12})\cos(\alpha - \beta) - (Y'_{22} - Y'_{12})\sin(\alpha - \beta) \\ Y'_{12} + (X'_{22} - X'_{12})\sin(\alpha - \beta) - (Y'_{22} - Y'_{12})\cos(\alpha - \beta) \\ 0 \end{bmatrix}$$

On the basis of coordinate values ($^o r_{21}$ and $^o r_{22}$) calculated by Equation 5, the TM position vectors ($^o t_1$ and $^o t_2$) can be defined as the following equation 6.

$$^o t_1 = ^o r_{21}$$

$$^o t_2 = ^o r_{22} \qquad \text{[Equation 6]}$$

When the position of an arbitrary TM is defined through coordinate values of the TM position vectors ($^o t_1$ and $^o t_2$), the position of TM present on the VM can be extended/calculated, and a detailed description thereof will hereinafter be described with reference to FIGS. 5 and 6.

Figure 5:
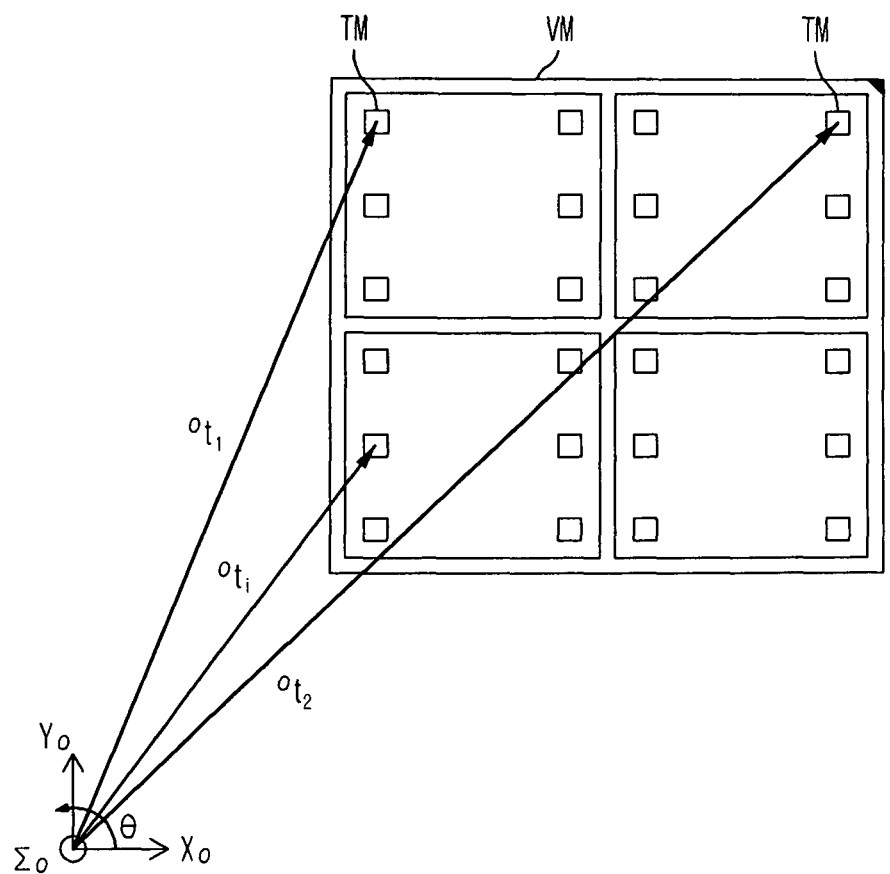
FIG. 5 illustrates the extension of a target mark (TM) for use in a maskless exposure according to example embodiments.

FIG. 5 illustrates the extension/calculation of a target mark (TM) for use in a maskless exposure according to example embodiments. FIG. 6 illustrates nominal position coordinates of an alignment mark (AM) from a CAD file in which a pattern to be exposed in a maskless exposure is designed.

Figure 6:
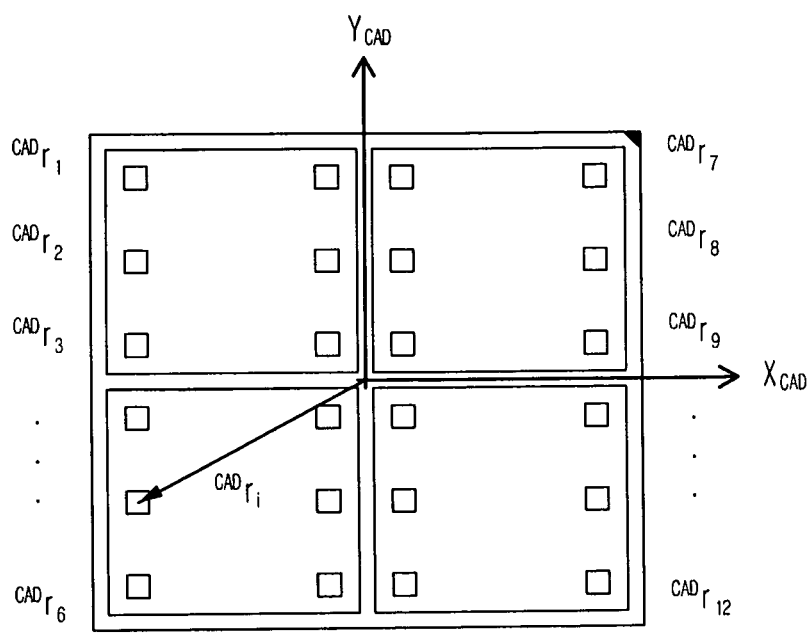
FIG. 6 illustrates nominal position coordinates of an alignment mark (AM) from a CAD file (indicating all drawing files for a mask design) in which a pattern to be exposed in a maskless exposure is designed.

Referring to FIGS. 5 and 6, through coordinate values (design value) on a CAD corresponding to coordinate values of the TM position vectors ($^o t_1$ and $^o t_2$), the arbitrary TM position may be calculated by the following equation 7 using a relative distance.

$$^o t_i = ^o t_1 + (^{CAD} r_i - ^{CAD} r_1)$$

In Equation 7, $^o t_1$ is a position vector of the first TM placed on the VM, $^o t_i$ is a position vector of an i-th TM located on the VM, and ($^{CAD} r_i - ^{CAD} r_1$) is a difference in nominal position coordinates between the i-th AM from the CAD file and the first AM from the CAD file.

Once the position of TM located on the VM is calculated, the alignment between the VM and the substrate (S) for an overlay for each layer (L; L1, L2 . . . . ) is performed using the calculated TM position. Once the VM relative position between the TM and the S is calculated in a maskless exposure process, a general alignment scheme requisite for the conventional mask exposure process may be used.

Although example embodiments disclose the 2-Point Global Alignment as the alignment scheme principal, example embodiments are not limited only thereto and a variety of alignment methods for mask exposure may be used, for example, an alignment method which uses the least-squares method through at least two alignment marks (AMs) for use in the conventional mask exposure. A detailed description thereof will hereinafter be described with reference to FIG. 7.

Figure 7:
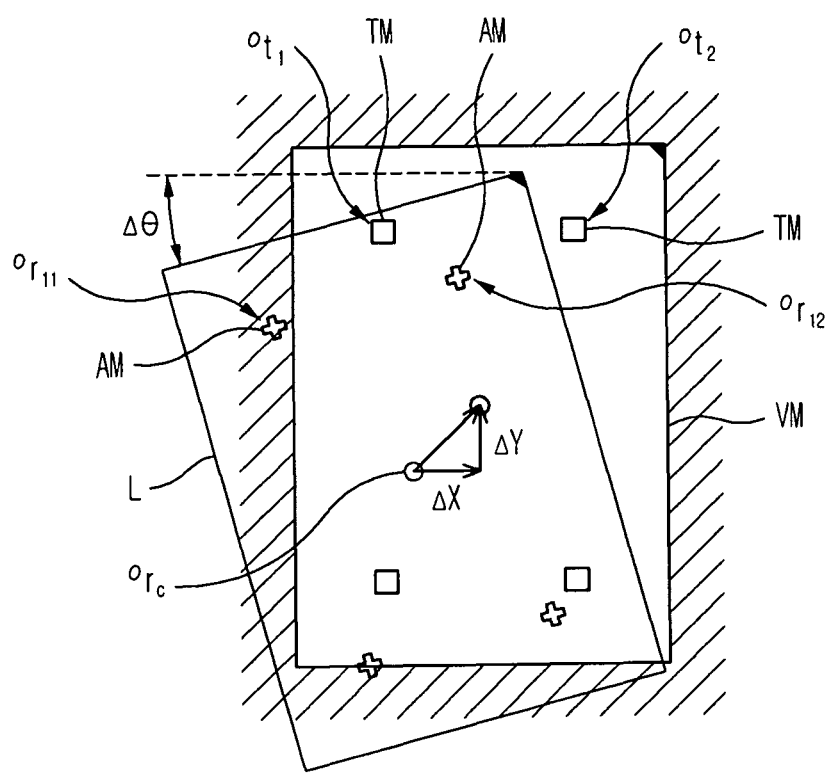
FIG. 7 illustrates an alignment method for performing an overlay in a maskless exposure according to example embodiments.

FIG. 7 illustrates an alignment method for performing an overlay in a maskless exposure according to example embodiments.

Referring to FIG. 7, physical amounts defined for the overlay arrangement using the virtual TM are as follows.

The following physical amounts are denoted by a two-dimensional vector amount (position vector).

$^o r_c$ is a center of rotation of the moving part 110, and is a desired value.

$^o r_{11}$ is the position of a first AM of the first layer.
$^o r_{12}$ is the position of a second AM of the first layer.
$^o t_1$ is a first TM of the VM.
$^o t_2$ is a second TM of the VM.

In the case where the substrate (S: wafer or glass) is put on the moving part 110 and the layer (L) is arranged on the substrate (S), the alignment between the substrate (S) and the VM is performed, such that a plurality of layers (L; L1, L2 . . . ) can be deposited over one substrate (S).

The physical amounts defined in tn the above-mentioned description can be represented by the following equation 8.

$$o_{r_c} = \begin{bmatrix} X_c \\ Y_c \\ 0 \end{bmatrix} = Xc, Yc, 0: \text{center of rotation} \quad \text{[Equation 8]}$$

$$o_{r_{12}} = \begin{bmatrix} X_{11} \\ Y_{11} \\ 0 \end{bmatrix} = X11, Y11, 0$$

$$o_{r_{12}} = \begin{bmatrix} X_{12} \\ Y_{12} \\ 0 \end{bmatrix} = X12, Y12, 0$$

$$o_{t_1} = \begin{bmatrix} X_{t1} \\ Y_{t1} \\ 0 \end{bmatrix} = Xt1, Yt1, 0$$

$$o_{t_2} = \begin{bmatrix} X_{t2} \\ Y_{t2} \\ 0 \end{bmatrix} = Xt2, Yt2, 0$$

First, after the first layer (L1) is exposed, developed, etched, and deposited, at any time just before the second layer (L2) is exposed by deposition of a photoresist (PR) material, coordinate values $^o r_{11}$ and $^o r_{12}$ present in the first layer L1 in the substrate (S) are measured using the alignment unit 140 as represented by Equation 8 (See FIG. 3).

Referring to Equation 8, by means of $^o r_{11}$ and $^o r_{12}$ coordinate values measured in the first layer (L1), an X-axis ($X_o$) angle ($\theta_g$) between AMs can be represented by the following equation 9.

$$\theta_g = \arg(^o r_{12} - {^o r_{11}}) \quad \text{[Equation 9]}$$

In addition, through coordinate values of the position vectors ($^o t_1$ and $^o t_2$) of the first and second TMs present on the VM, an X-axis ($X_o$) angle ($\theta_{g'}$) between TMs can be represented by the following equation 10.

$$\theta_{g'} = \arg(^o t_2 - {^o t_1})$$

Based on the angles $\theta_g$ and $\theta_{g'}$ calculated by Equations 9 and 10, the rotation moving amount $\Delta\theta$ (i.e., the moving amount of the moving part rotating on Z-axis) for the overlay can be represented by the following equation 11.

$$\Delta\theta = \theta_{g'} - \theta_g \quad \text{[Equation 11]}$$

Subsequently, XY moving amounts $\Delta X$ and $\Delta Y$ ($\Delta X$: moving amount of the moving part moving on X-axis, and $\Delta Y$: moving amount of the moving part moving on Y-axis) for the moving part 110 for the overlay can be represented by the following equation 12.

$$\begin{bmatrix} \Delta\theta \\ \Delta X \\ \Delta Y \end{bmatrix} = \quad \text{[Equation 12]}$$

$$\begin{bmatrix} \arg(o_{t_2} - o_{t_1}) - \arg(o_{r_{12}} - o_{r_{11}}) \\ -X_{11}\cos\Delta\theta - X_c(1-\cos\Delta\theta) + (Y_{11} - Y_c)\sin\Delta\theta + X_{t1} \\ -Y_{11}\cos\Delta\theta - Y_c(1-\cos\Delta\theta) + (X_c - X_{11})\sin\Delta\theta + Y_{t1} \end{bmatrix}$$

By means of the moving amounts ($\Delta\theta$, $\Delta X$, $\Delta Y$) of the moving part 110 for the overlay as shown in Equation 12, the controller 160 controls the driving of the moving part 110 until the AM carved in the substrate (S) and the TM present on the VM are arranged.

As described above, the controller 160 arranges the alignment between the substrate (S) and the VM by controlling the driving of the moving part 110, such that a plurality of layers (L: L1, L2 . . . . ) can be deposited on one substrate (S).

Although example embodiments for searching for the TM performs PR development on the layer (L) to be deposited on the substrate (S), re-loads the substrate (S) on the moving part 110, and thus searches for the TM position, example embodiments are not limited only thereto, and the Polaroid principle, for example, may be used in example embodiments.

Assuming that a material capable of being immediately identified by exposure is deposited over the substrate (S) according to the Polaroid principle, there is no need to perform development, such that the process for measuring the AM position after the substrate (S) loading may be omitted.

As is apparent from the above description, the maskless exposure device and the alignment method for achieving an overlay in a maskless exposure according to example embodiments use a virtual mask that serves as the same role as in a mask for use in a conventional mask exposure, introduce a virtual target mark that serves as the same role as in an alignment mark of the conventional mask exposure, and perform an overlay per layer, such that the deposition exposure can be achieved in the maskless exposure.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A maskless exposure device comprising:
   a stage configured to move a substrate;
   a light modulation element configured to illuminate an exposure beam of a beam spot array form to expose a pattern on a layer, the layer on the substrate, and generate a virtual mask;
   an alignment unit configured to measure a position of an alignment mark in the layer; and
   a controller configured to calculate a position of a target mark present on the virtual mask using the measured alignment mark position, and perform alignment between the virtual mask and the substrate using the calculated target mark position.

2. The maskless exposure device according to claim 1, wherein the light modulation element is further configured to expose the pattern on at least one layer of a plurality of layers on the substrate.

3. The maskless exposure device according to claim 2, wherein each layer includes at least two alignment marks.

4. The maskless exposure device according to claim 2, wherein the alignment unit is configured to measure the position of the alignment mark for each layer.

5. The maskless exposure device according to claim 2, wherein the alignment unit is further configured to measure the position of the alignment mark present on an i-th layer on the substrate after a fabrication process is performed on the i-th layer of the plurality of layers and prior to exposing the (i+1)-th layer.

6. The maskless exposure device according to claim 5, wherein the fabrication process includes at least one of exposing, developing, etching, depositing and depositing a photoresist on the substrate.

7. The maskless exposure device according to claim 5, wherein the controller is configured to calculate a position between the calculated target mark position and the measured alignment mark position relative to each other, and to determine an amount by which the stage is moved such that an overlay of the calculated target mark and the measured alignment mark is achieved for each layer in response to the calculated relative position.

8. The maskless exposure device according to claim 7, wherein the controller is further configured to compensate the amount by which the stage moves to be equal to the calculated relative position before the (i+1)-th layer is exposed, and to perform alignment between the virtual mask and the substrate.

9. The maskless exposure device according to claim 7, wherein the target mark is a virtual alignment mark that is used as a reference during alignment of the overlay.

10. An alignment method for overlay in a maskless exposure comprising:
    placing a substrate on a stage;
    generating a virtual mask using a light modulation element so as to expose a pattern on the substrate;
    measuring a position of an alignment mark in the layer;
    calculating a position of a target mark on the virtual mask using the measured alignment mark position; and
    performing alignment between the virtual mask and the substrate using the calculated target mark position.

11. The alignment method according to claim 10, further comprising:
    exposing the pattern on at least one layer of a plurality of layers on the substrate.

12. The alignment method according to claim 11, further comprising:
    measuring the position of the alignment mark present on an i-th layer on the substrate after a fabrication process is performed on the i-th layer of the plurality of layers and prior to exposing the (i+1)-th layer.

13. The alignment method according to claim 12, wherein the fabrication process includes at least one of exposing, developing, etching, depositing and depositing a photoresist on the substrate.

14. The alignment method according to claim 12, further comprising:
    calculating a position between the calculated target mark position and the measured alignment mark position relative to each other;
    determining an amount by which the stage is moved according to the calculated relative position; and
    compensating for the determined moving amount of the stage, and performing overlay of the plurality of layers.

15. The alignment method according to claim 14, further comprising:
    using the target mark as a reference during aligning of the overlay of the plurality of layers, the target mark being a virtual alignment mark.

* * * * *